United States Patent
Danson et al.

(10) Patent No.: US 9,906,233 B2
(45) Date of Patent: Feb. 27, 2018

(54) ANALOGUE-TO-DIGITAL CONVERSION

(71) Applicant: SOCIONEXT INC., Yokohama-shi, Kanagawa (JP)

(72) Inventors: John James Danson, Stittsville (CA); Ian Juso Dedic, Northolt (GB); Prabhu Ashwin Harold Rebello, Woking Surrey (GB)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/455,988

(22) Filed: Mar. 10, 2017

(65) Prior Publication Data

US 2017/0264308 A1 Sep. 14, 2017

(30) Foreign Application Priority Data

Mar. 11, 2016 (EP) .................................. 16160042

(51) Int. Cl.
*H03M 1/06* (2006.01)
*H03M 1/10* (2006.01)
*H03M 1/12* (2006.01)
*H03M 1/38* (2006.01)

(52) U.S. Cl.
CPC ....... *H03M 1/0675* (2013.01); *H03M 1/1076* (2013.01); *H03M 1/1225* (2013.01); *H03M 1/1245* (2013.01); *H03M 1/38* (2013.01); *H03M 1/1009* (2013.01)

(58) Field of Classification Search
None
See application file for complete search history.

(56) References Cited

U.S. PATENT DOCUMENTS

| 8,779,961 | B2 * | 7/2014 | Sutardja | H03M 1/002 341/141 |
| 2005/0134490 | A1 * | 6/2005 | Cox | G06F 3/05 341/141 |
| 2009/0201188 | A1 * | 8/2009 | Boisvert | G03B 42/02 341/155 |
| 2015/0022385 | A1 * | 1/2015 | D'Souza | H03M 1/1071 341/120 |

FOREIGN PATENT DOCUMENTS

| EP | 2 211 468 A1 | 7/2010 |
| EP | 2 827 499 A2 | 1/2015 |
| EP | 2 849 345 A1 | 3/2015 |
| WO | WO 2013/067137 A2 | 5/2013 |

OTHER PUBLICATIONS

B. Ginsburg et al., Highly Interleaved 5-bit, 250-MSample/s, 1.2-mW ADC With Redundant Channels in 65-nm CMOS, IEEE Journal of Solid-State Circuits, vol. 43, No. 12, Dec. 2008.*
Extended European Search Report of related European Patent Application No. 16160042.4 dated Sep. 2, 2016.

* cited by examiner

*Primary Examiner* — Howard Williams
(74) *Attorney, Agent, or Firm* — Arent Fox LLP

(57) ABSTRACT

There is disclosed herein analogue-to-digital converter circuitry, comprising a set of sub-ADC units each for carrying out analogue-to-digital conversion operations, the set comprising a given number of core sub-ADC units for carrying out said given number of core conversion operations. Also provided is control circuitry operable, when a said sub-ADC unit is determined to be a defective sub-ADC unit, to cause the core conversion operations to be carried by the sub-ADC units of the set sub-ADC units other than the defective sub-ADC unit.

10 Claims, 11 Drawing Sheets

ANALOGUE-TO-DIGITAL CONVERSION

CROSS-REFERENCE TO RELATED APPLICATIONS

This application claims priority to European Patent Application No. 16160042.4, filed Mar. 11, 2016. The disclosure of the priority application is incorporated in its entirety herein by reference.

The present invention relates to analogue-to-digital converter circuitry and methods.

Architectures for realising analogue-to-digital converters (ADCs) generally fall into one of three categories, namely low-to-medium speed (e.g. integrating and oversampling ADCs), medium speed (e.g. algorithmic ADCs) and high speed (e.g. time-interleaved ADCs).

Figure 1:
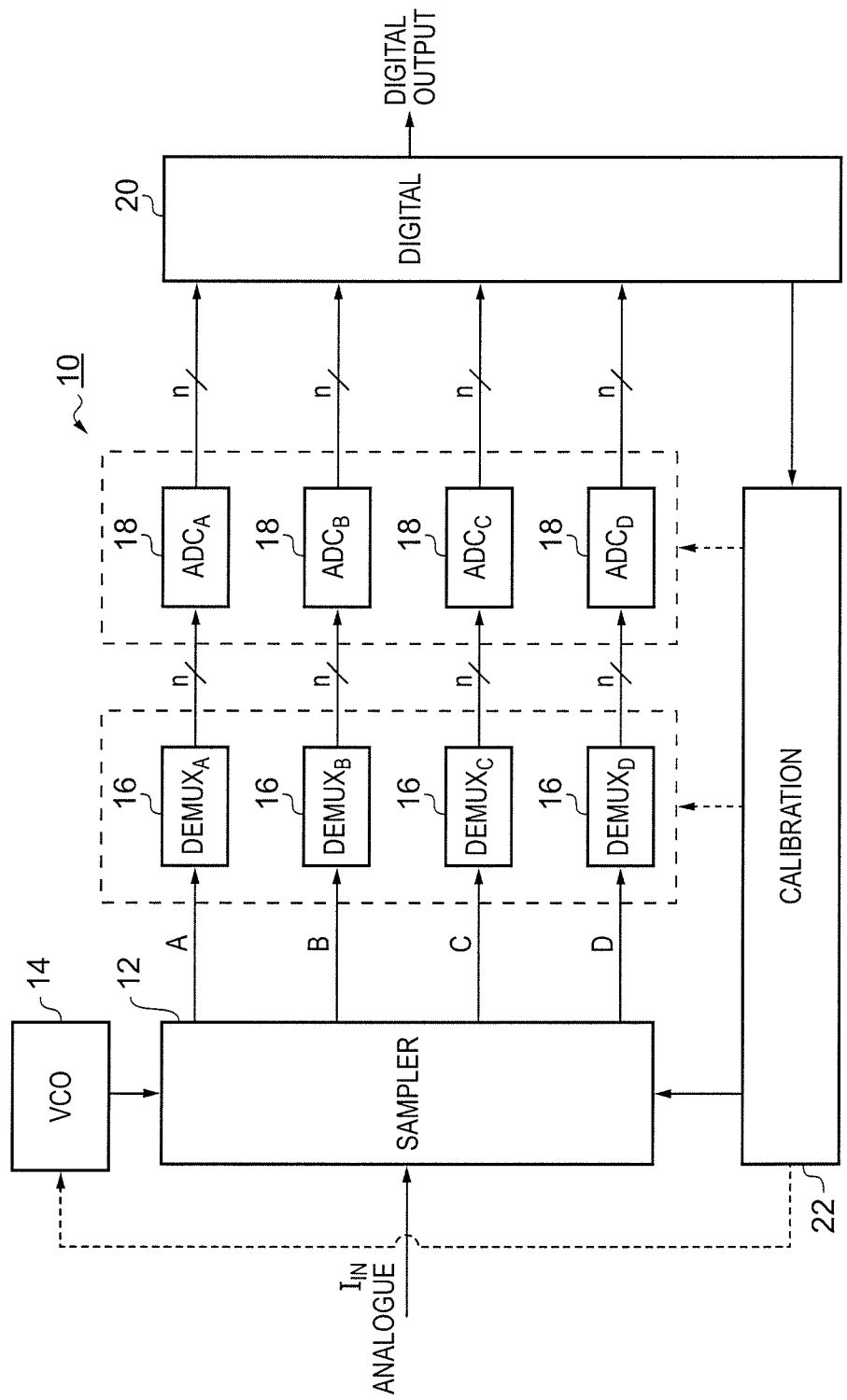

The main idea behind time-interleaved ADCs is to obtain very-high-speed analogue-to-digital conversion by operating many sub-ADC units (circuits) in parallel. By way of background, FIG. 1 is a schematic diagram of previously-considered analogue-to-digital converter circuitry 10. Such circuitry is explained in full detail in EP2211468, the entire contents of which are incorporated herein by reference. Circuitry 10 comprises sampler 12, voltage-controlled oscillator (VCO) 14, demultiplexers 16, ADC banks 18, digital unit 20 and calibration unit 22.

The sampler 12 is configured to perform four-way or four-phase time-interleaving so as to split the input current $I_{IN}$ into four time-interleaved sample streams A to D. For this purpose, VCO 14 is a quadrature VCO operable to output four clock signals 90° out of phase with one another, for example as four raised cosine signals. VCO 14 may for example be a shared 14 GHz quadrature VCO to enable circuitry 10 to have an overall sample rate of 56 GS/s.

Each of streams A to D comprises a demultiplexer 16 and an ADC bank 18 of sub-ADC units connected together in series as shown in FIG. 1. This sampler 12 operates in the current mode and, accordingly, streams A to D are effectively four time-interleaved streams of current pulses originating from (and together making up) input current each stream having a sample rate one quarter of the overall sample rate. Continuing the example overall sample rate of 56 GS/s, each of the streams A to D may have a 14 GS/s sample rate.

Focusing on stream A by way of example, the stream of current pulses is first demultiplexed by an n-way demultiplexer 16. Demultiplexer 16 is a current-steering demultiplexer and this performs a similar function to sampler 12, splitting stream A into n time-interleaved streams each having a sample rate equal to 1/4n of the overall sample rate. Continuing the example overall sample rate of 56 GS/s, the n output streams from demultiplexer 16 may each have a 14/n GS/s sample rate. If n were to be 80 or 160 for example, the output streams of demultiplexer 16 may have a 175 MS/s or 87.5 MS/s sample rate, respectively. Demultiplexer 16 may perform the 1:n demultiplexing in a single stage, or in a series of stages. For example, in the case of n=80, demultiplexer 16 may perform the 1:n demultiplexing by means of a first 1:8 stage followed by a second 1:10 stage.

The n streams output from demultiplexer 16 pass into ADC bank 18, which contains n sub-ADC units each operable to convert its incoming pulse stream into digital signals, for example into 8-bit digital values. Accordingly, n digital streams pass from ADC bank 18 to digital unit 20. In the case of n=80, the conversion rate for the sub-ADC units may be 320 times slower than the overall sample rate.

Streams B, C, and D operate analogously to stream A, and accordingly duplicate description is omitted. In the above case of n=80, circuitry 10 may be considered to comprise 320 ADC sub-units split between the four ADC banks 18.

The four sets of n digital streams are thus input to the digital unit 20 which multiplexes those streams to produce a single digital output signal representative of the analogue input signal, current $I_{IN}$. This notion of producing a single digital output may be true schematically, however in a practical implementation it may be preferable to output the digital output signals from the ADC banks in parallel.

Calibration unit 22 is connected to receive a signal or signals from the digital unit 20 and, based on that signal, to determine control signals to be applied to one or more of the sampler 12, VCO 14, demultiplexers 16 and ADC banks 18. It is preferable, as explained in EP2211468, to carry out calibration on the sampler 12, which is why the output from calibration unit 22 to the sampler 12 is shown as a solid arrow in FIG. 1, rather than as a dashed arrow.

Figure 2:
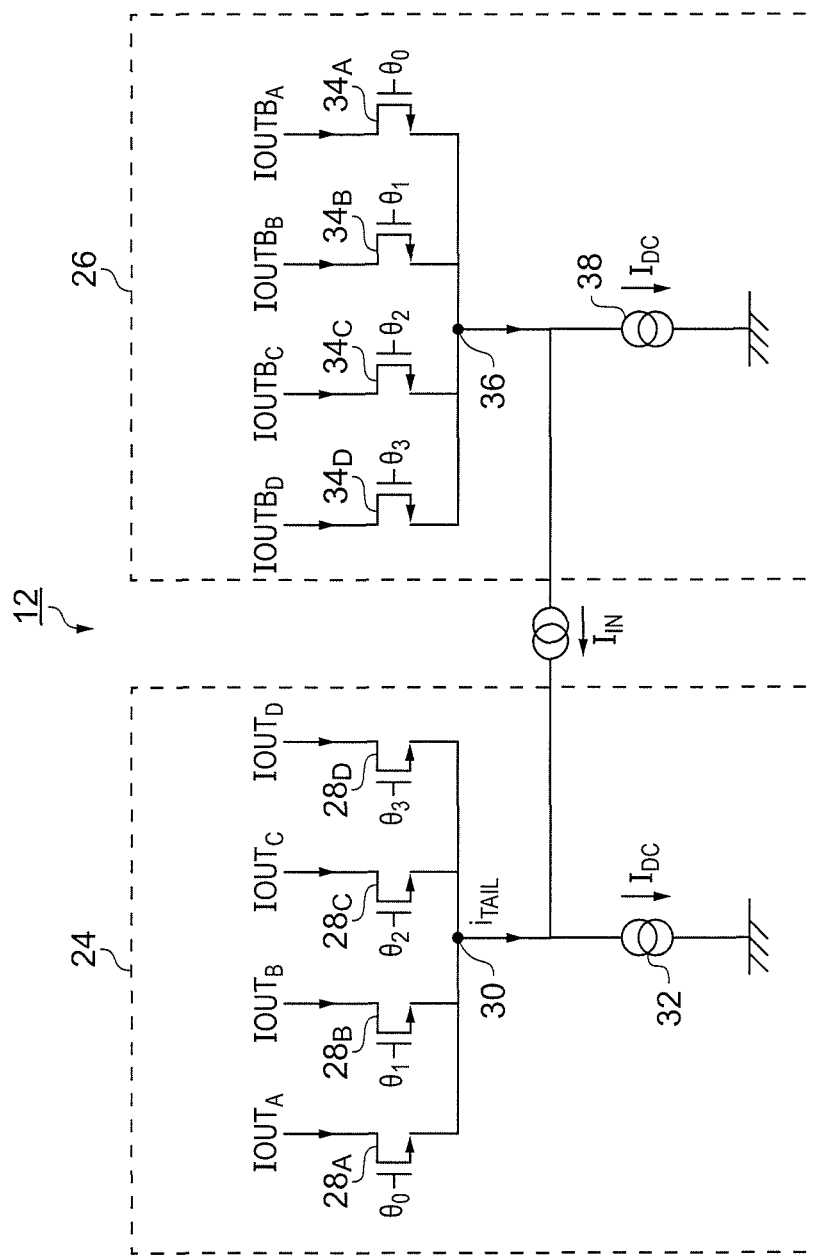

FIG. 2 is a schematic circuit diagram of four-phase (i.e. multiphase) current-mode (current-steering) sampler 12. Although in FIG. 1 a single-ended input signal, current $I_{IN}$, is shown, it will be appreciated that a differential input signal could be employed, for example to take advantage of common-mode interference rejection. Accordingly, the sampler 12 and demultiplexers 16 and ADC banks 18 could be effectively duplicated in circuitry 10 to support such differential signaling, however such duplication is omitted from FIG. 1 for simplicity. Returning to FIG. 2, sampler 12 is configured to receive such a differential input current signal, modeled here as a current source $I_{IN}$ whose magnitude varies with the input signal.

Because of the differential signaling, sampler 12 effectively has two matching (or corresponding or complementary) sections 24 and 26 for the two differential inputs. Accordingly, there is a first set of output streams $IOUT_A$ to $IOUT_D$ in section 24 and a second set of matching output streams $IOUTB_A$ to $IOUTB_D$, where IOUTB means $\overline{IOUT}$, and wherein $IOUT_A$ is paired with $IOUTB_A$, $IOUT_B$ is paired with $IOUTB_B$, and so on and so forth.

Focusing on the first section 24 by way of example (because the second section 26 operates analogously to the first section 24), there are provided four n-channel MOSFETs $28_A$ to $28_D$ (i.e. one per stream or path) with their source terminals connected together at a common tail node 30.

The aforementioned current source $I_{IN}$ is connected between common tail node 30 and an equivalent common tail node 36 of section 26. A further current source $I_{DC}$ 32 is connected between the common tail node 30 and ground supply, and carries a constant DC current $I_{DC}$. The gate terminals of the four transistors $28_A$ to $28_D$ are driven by the four clock signals $\theta_0$ to $\theta_3$, respectively, provided from the VCO 24.

As mentioned above, section 26 is structurally similar to section 24 and thus comprises transistors $34_A$ to $34_D$, common tail node 36 and current source $I_{DC}$ 38.

Figure 3:
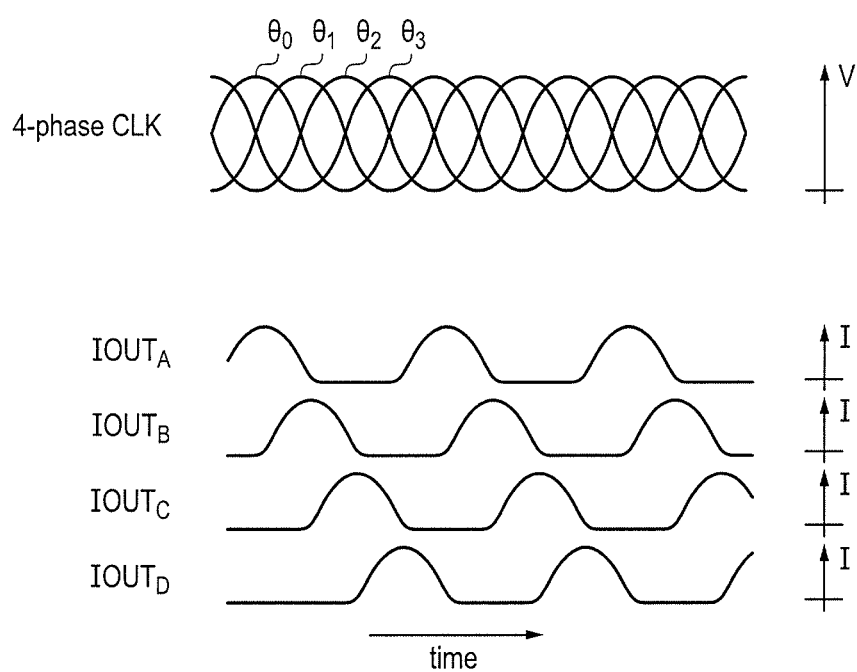

FIG. 3 shows schematic waveforms for the clock signals $\theta_0$ to $\theta_3$ in the upper graph, and schematic waveforms for the corresponding output currents $IOUT_A$ to $IOUT_D$ in the lower graph.

The clock signals $\theta_0$ to $\theta_3$ are time-interleaved raised cosine waveforms provided as four voltage waveforms from the VCO 44. The use of four clock signals in the present case is due to the four-way-interleaving design of ADC circuitry 10, but it will be appreciated that, in another embodiment, three or more time-interleaved clock signals could be used, for a three-or-more-way split of the input current signal.

Clock signals $\theta_0$ to $\theta_3$ are 90° out of phase with one another, such that $\theta_0$ is at 0° phase, $\theta_1$ is at 90° phase, $\theta_2$ is at 180° phase, and $\theta_3$ is at 270° phase.

The effect of sampling circuitry 12, under control of clock signals $\theta_0$ to $\theta_3$, is that the output currents $IOUT_A$ to $IOUT_D$ are four trains (or streams) of current pulses, the series of pulses in each train having the same period as one of the clock signals $\theta_0$ to $\theta_3$, and the pulses of all four trains together being time-interleaved with one another as an effective overall train of pulses at a quarter of the period of one of the clock signals (or at four times the sampling frequency of one of the clock signals).

Figure 4:
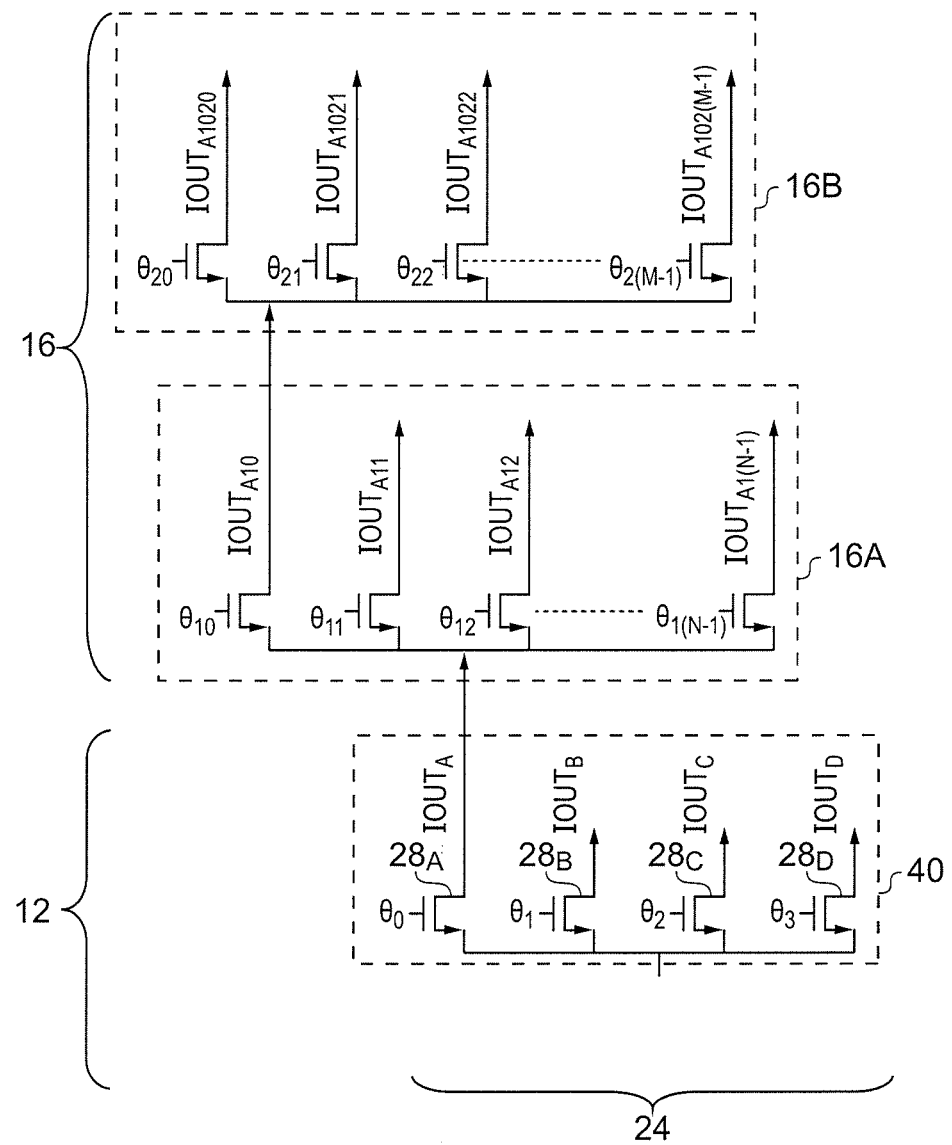

FIG. 4 is a schematic circuit diagram of parts of ADC circuitry 10 useful for understanding the structure and operation of the demultiplexers 16. For simplicity, only part of the sampler circuitry 12 is shown. That is, only the "plus" section 24 is shown, and elements of that "plus" section 24 are omitted to avoid over-complicating FIG. 4.

Regarding the demultiplexers 16, only the demultiplexing circuitry 16 for output $IOUT_A$ is shown. Similar circuitry may also be provided for the other seven outputs $IOUT_B$ to $IOUT_D$, and $IOUTB_A$ to $IOUTB_D$.

As shown in FIG. 4, demultiplexers 16 in the present embodiment are formed of two stages, namely stages 16A and 16B. The first stage 46A performs 1:N demultiplexing, and the second stage 16B performs 1:M demultiplexing.

Stages 16A and 16B generally have the same structure as the array of sampling switches of the sampling circuitry 12 shown in FIG. 2 and denoted here by box 40. That is, each stage comprises a plurality of transistors (in this case, n-channel MOSFETs) whose source terminals are connected together at a common tail node.

From the above description of sampling the circuitry 12, and considering only the "plus" section 24 by way of example, it will be appreciated that the circuitry splits the input current $I_{IN}$ into X time-interleaved trains of pulses, where X=4 in the present embodiment. In the present embodiment, those pulse trains are provided at outputs $IOUT_A$ to $IOUT_D$. Sampling circuitry 12 can thus be thought of as performing a 1:X demultiplexing function. In the same way, each output from sampler 12 can be further 1:N demultiplexed by a stage 16A, and each output of a stage 16A can be further 1:M demultiplexed by a stage 16B.

Only one complete demultiplexed path is shown in FIG. 4. That is, input current $I_{IN}$ is demultiplexed to provide X (X=4 in the present case) outputs $IOUT_A$ to $IOUT_D$. Each of those outputs is then 1:N demultiplexed by a stage 16A, however this is only shown in FIG. 4 in respect of the left-most output $IOUT_A$. Consequently, the outputs from that shown stage 16A are outputs $IOUT_{A10}$ to $IOUT_{A1(N-1)}$. Each of those outputs (for all stages 16A) is then 1:M demultiplexed by a stage 16B, however this is again only shown in FIG. 4 in respect of the left-most output $IOUT_{A10}$. Consequently, the outputs from that shown stage 16B are outputs $IOUT_{A1020}$ to $IOUT_{A102(M-1)}$. Corresponding outputs are produced by the other stages 16B.

The sampling circuitry 12 and demultiplexers 16 together carry out a 1:Z demultiplexing function, where Z=X×N×M. In the present embodiment, X=4, N=8 and M=10. Thus, the present embodiment performs 1:320 demultiplexing, which leads to 320 outputs on the "plus" side 24 and a corresponding 320 outputs on the "minus" side 26.

Figure 5:
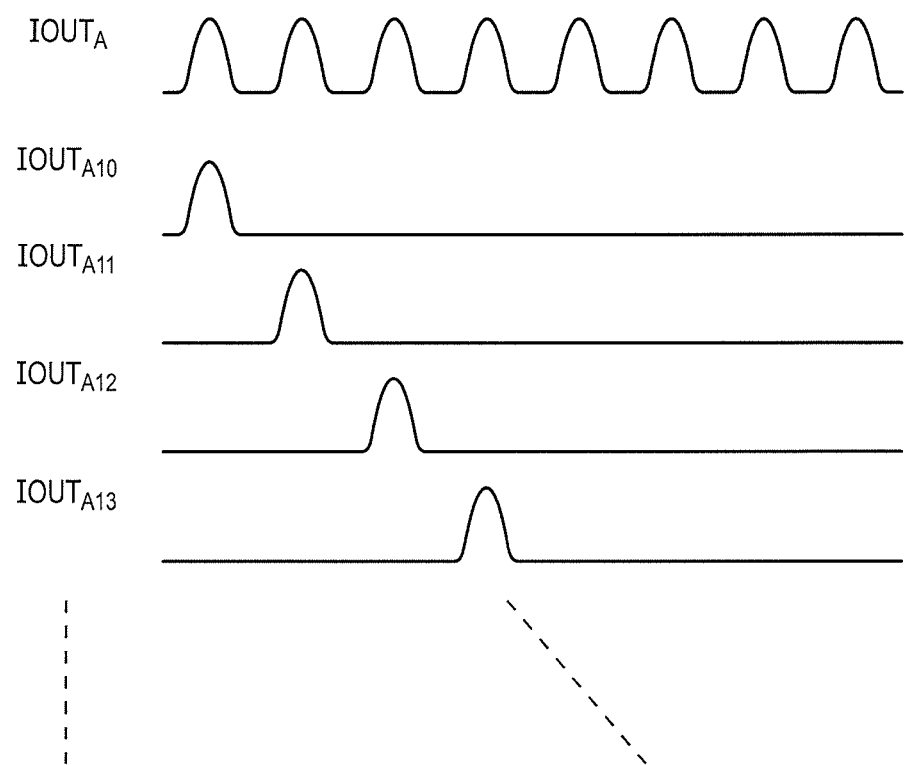

FIG. 5 is a schematic diagram useful for understanding further the operation of demultiplexers 46. The uppermost trace shows a pulse train at output $IOUT_A$ of the sampling circuitry 42, and the traces below represent corresponding pulse trains of outputs $IOUT_{A10}$ to $IOUT_{A1(N-1)}$ (only $IOUT_{A10}$ to $IOUT_{A13}$ are shown) of a stage 46A. As can be appreciated from FIG. 5, pulse train $IOUT_A$ is effectively split up into N pulse trains each at 1/N the sample rate of pulse train $IOUT_A$.

Looking back to FIG. 1, the output signals from demultiplexers 16 pass into ADC banks 18. ADC banks 18 are used to produce digital values corresponding to the areas of the respective current pulses input thereto.

Figure 6:
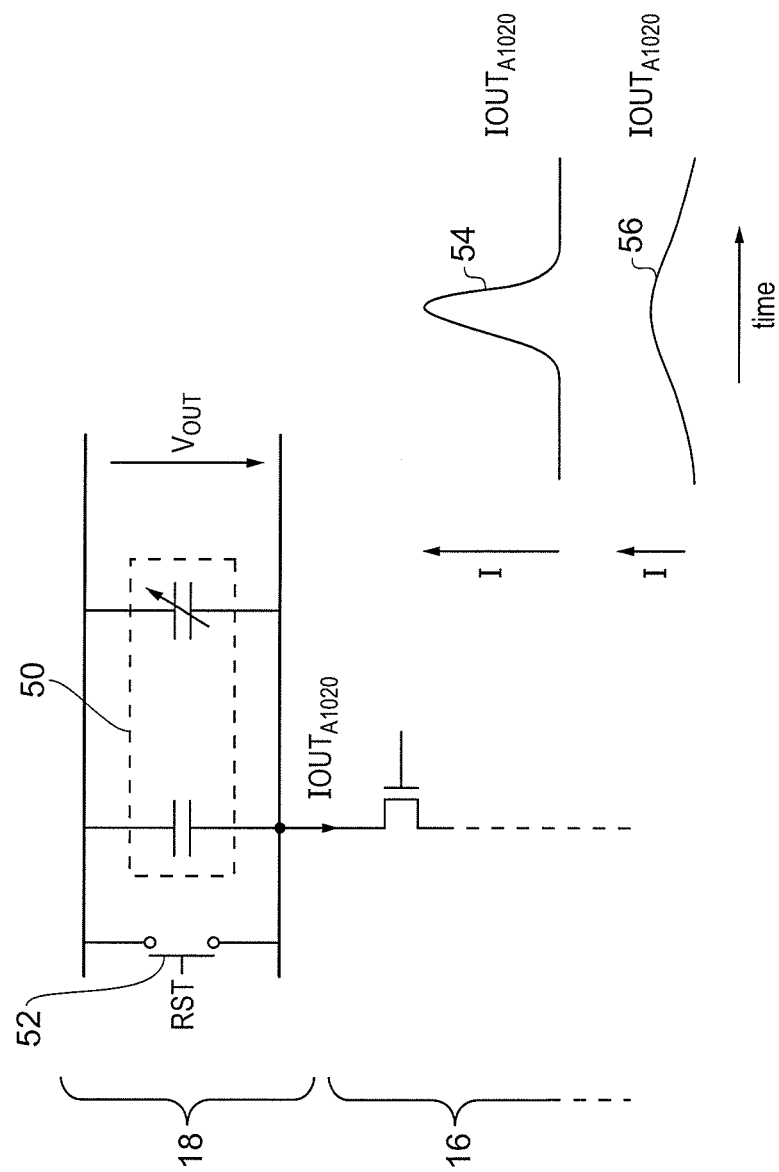

FIG. 6 is a schematic diagram useful for understanding the principle of operation of ADC banks 18. For simplicity, only one output, $IOUT_{A1020}$, of demultiplexers 16 is shown, and consequently the ADC circuitry 18 shown represents only the ADC circuitry required for that particular output, and could be referred to as part of a sub-ADC unit. Similar ADC circuitry 18 may be provided for all the outputs of the demultiplexers 16.

ADC circuitry 18 generally takes the form of a capacitance 50. As shown in FIG. 6, capacitance 50 may be variable in value, such that its value can be trimmed during calibration or during an initial setup phase. Generally speaking, capacitance 50 is employed to convert the current pulses from output $IOUT_{A1020}$ into voltage values $V_{OUT}$. That is, each pulse charges up capacitance 50 to a voltage proportional to the area of the pulse concerned. This is because the amount of charge in each current pulse is defined by its area (Q=∫Idt), and because the voltage across the capacitance 50 is defined by that amount of charge Q and the capacitance value C (V=Q/C).

The voltage $V_{OUT}$ for a particular pulse is held across capacitance 50 until the circuitry 18 is reset by reset switch 52. Whilst the voltage $V_{OUT}$ for a particular pulse is held, this analog output value can be converted into a digital output value, for example using an ADC circuit (sub-ADC unit) employing a successive-approximation register (SAR). In the case of differential circuitry, as in the present embodiment, each $V_{OUT}$ will have its complementary $V_{OUT}$, and the pair may be applied together to a differential comparator so that a single digital output for that pair is output.

An advantage of this mode of operation is that even if delays are experienced within the demultiplexers 46, the charge in each pulse will still make it to the relevant outputs, albeit over a slightly longer period. In that case, the voltage $V_{OUT}$ produced from the pulse remains unaffected. To illustrate this point, two examples 54 and 56 of the same current pulse are shown in FIG. 6. The first pulse 54 represents a case in which minimal delay is experienced. The second pulse 56 represents a case in which some delay is experienced, for example due to track capacitance in the circuitry. Consequently, pulse 56 is stretched in time as compared to pulse 54. Importantly, the area of the two pulses 54 and 56 is substantially the same, and thus the output voltage $V_{OUT}$ would be the same for both.

Figure 7:
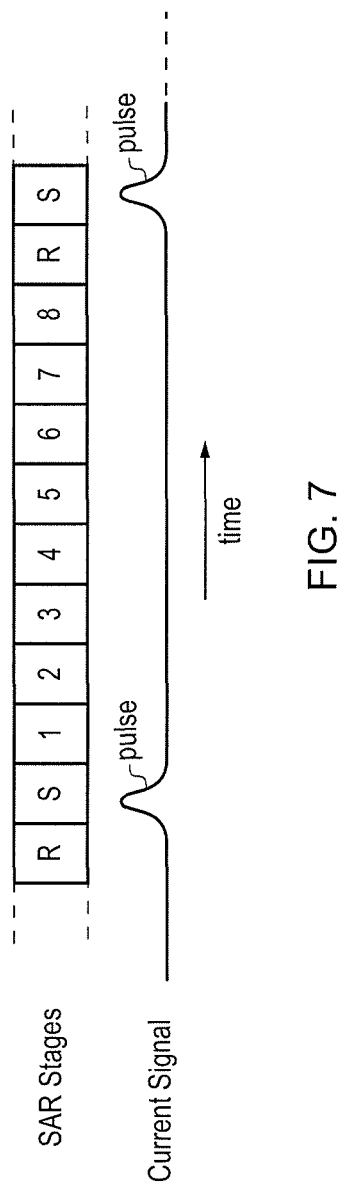

FIG. 7 is a schematic diagram useful for understanding a possible application of SAR-ADC (Successive Approximation Register—Analogue-to-Digital Conversion) circuitry to circuitry 18 in FIG. 6. Such circuitry could have a cycle of phases of the form: Reset (R); Sample (S); 1; 2; 3; 4; 5; 6; 7 and 8, as shown in FIG. 7. In each Sample phase, a current pulse concerned may be converted into an output voltage $V_{OUT}$, and subsequently that voltage $V_{OUT}$ may be turned into an 8-bit digital value over the following 8 SAR stages. The next Reset stage then prepares the circuitry for the next current pulse.

Figure 8:
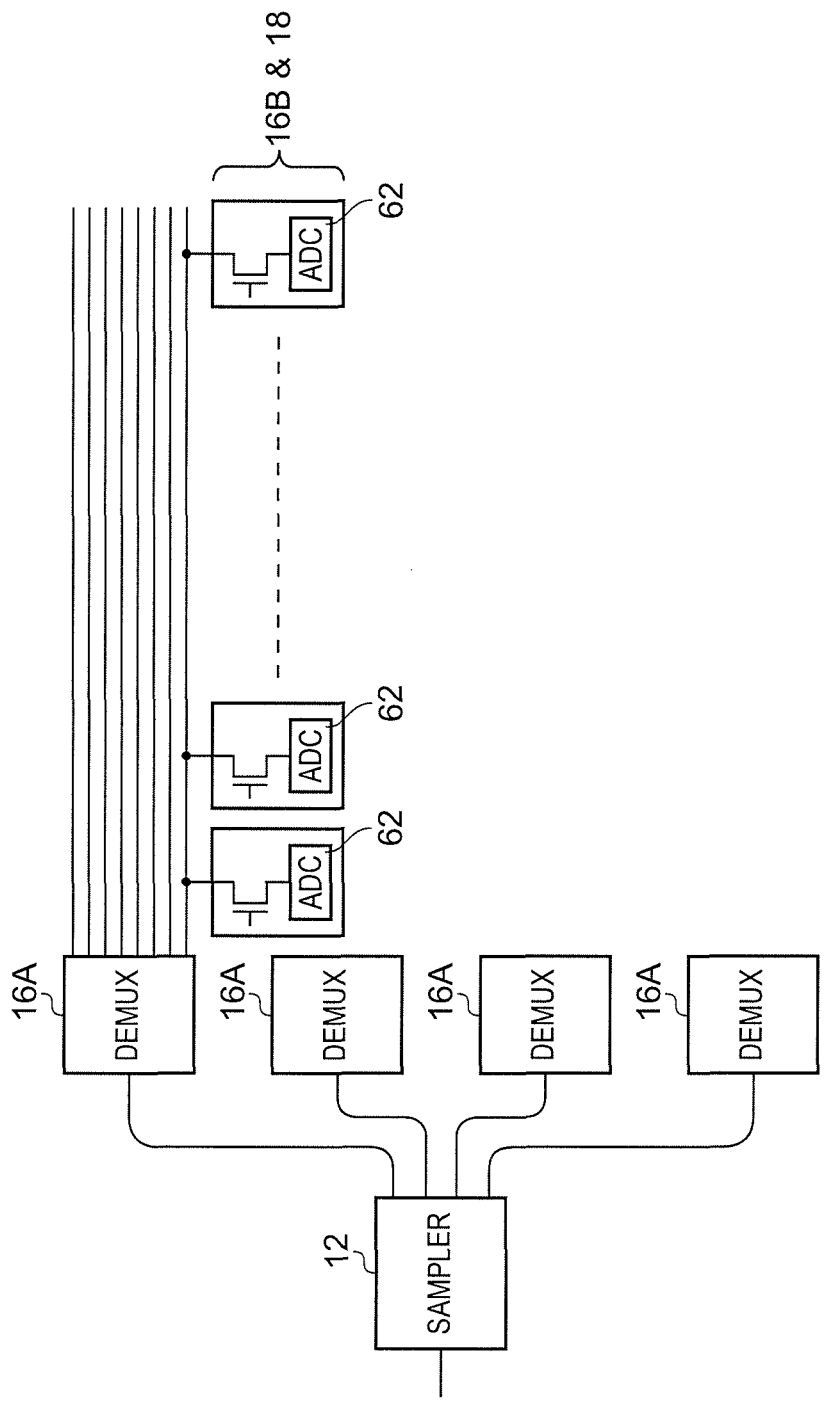

FIG. 8 is a schematic diagram useful for understanding a possible layout for ADC circuitry 10. Only certain parts of circuitry 10 are shown for simplicity. As can be seen from FIG. 8, and assuming that X=4, N=8 and M=10, the sampler 12 has four outputs to four demultiplexer first stages 16A. Each demultiplexer stage 16A has 8 outputs (this is only shown for the uppermost demultiplexer first stage 16A) to 8 demultiplexer second stages 16B (only one of the 8 demultiplexer second stages 16B is shown, being for the lowermost output of the uppermost demultiplexer first stage 16A). Each demultiplexer second stage 16B has 10 outputs each to its own ADC. In the way shown in FIG. 8, it is possible to distribute the switches of the demultiplexer second stages 16B so that they are close to their respective sub-ADC circuits of the ADC bank 18, thereby to minimize track length between the final switches and the capacitances 50.

As mentioned above, with reference to FIG. 1, calibration unit 22 is provided in ADC circuitry 10 to calibrate its operation. In particular, calibration unit 22 is capable of performing such calibration of the ADC circuitry 10 in use, i.e. without the need to take it "off-line".

The operation of the calibration unit 22 relies on the principle that the sampling circuitry 12 divides up the input current into streams of current pulses, i.e. that all of the current that is sampled appears in the pulses at the output. The general idea is that timing errors in the VCO/sampler clocks or switches affect the areas of the current pulses, and therefore the ADC output value.

Figure 9:
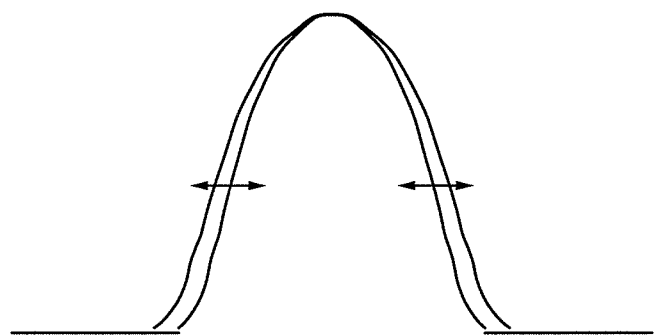

More particularly, as illustrated in FIG. 9, because all the current is divided up into pulses, if one pulse is increased in area (from its expected area in an error-free environment) due to such an error, then another pulse or set of pulses must see a corresponding decrease in area because the input current is divided up into the output currents (without current being added or removed). Similarly, if one pulse is decreased in area due to an error, then another pulse or set of pulses must see a corresponding increase in area. This principle and related techniques for calibration are explained in EP2211468 relation to its FIGS. 23 and 24 in more detail.

For the present purposes, it will be appreciated that different types of error (mismatch) may result in different patterns of change in the averaged digital output powers, and therefore that such different types of error may be detected independently of one another or at least compensated for, or calibrated out. Different such types of error may be present simultaneously, however even in this case the various errors may be detected and compensated for by comparing the powers with one another. Following detection of such errors (mismatches), the calibration circuitry 22 may be used to adjust operation of the ADC circuitry 10 to compensate for those errors. Because the errors are detected by averaging real output signals, the calibration can be carried out "online".

Despite the provision of such calibration circuitry 22 and the accuracy benefits afforded by the current-mode operation of the circuitry 10, it has been found that noise and distortion problems remain in the circuitry 10.

It is desirable to solve some or all of the above-mentioned problems.

According to an embodiment of a first aspect of the present invention there is provided analogue-to-digital converter circuitry, comprising: a set of sub-ADC units each for carrying out analogue-to-digital conversion operations, the set comprising a given number of core sub-ADC units for carrying out said given number of core conversion operations; and control circuitry operable, when a said sub-ADC unit is determined to be a defective sub-ADC unit, to cause the core conversion operations to be carried out by the sub-ADC units of the set of sub-ADC units other than the defective sub-ADC unit.

Thus, the analogue-to-digital converter circuitry is able to continue to carry out the core conversion operations without the defective sub-ADC unit contributing to noise and distortion in the overall output of the circuitry. Naturally, the control circuitry may be operable, when no said sub-ADC unit of said core sub-ADC units of the set is determined to be a defective sub-ADC unit, to cause the core conversion operations to be carried out by the core sub-ADC units of the set.

The control circuitry may be operable, when one of the core sub-ADC units of the set is determined to be a defective sub-ADC unit, to cause the core conversion operations to be carried out by the other core sub-ADC units of the set. For example, the control circuitry may operable when said one of the core sub-ADC units of the set is determined to be a defective sub-ADC unit to cause the other core sub-ADC units of the set to carry out the core conversion operations at a faster rate than a rate at which they carry out the core conversion operations when no said sub-ADC unit of said core sub-ADC units of the set is determined to be a defective sub-ADC unit. One way of achieving conversion at a faster rate is to convert at a lower resolution, e.g. step down from 8-bit conversion to 7-bit conversion. Another way is to literally operate the sub-ADC units concerned faster, e.g. with higher VDD or higher clock frequencies, perhaps using asynchronous rather than synchronous conversion.

As another option, the set of sub-ADC units may comprise at least one spare sub-ADC unit in addition to said core sub-ADC units. In this case, the control circuitry may be operable, when one of said core sub-ADC units of the set is determined to be a defective sub-ADC unit, to cause the core conversion operations to be carried out by the spare and core sub-ADC units of the set of sub-ADC units other than the defective sub-ADC unit. That is, a defective core-sub-ADC unit may be operationally replaced with the spare sub-ADC unit.

The sub-ADC units of the set may be organised into an order, and this order may follow the order in which they are physically implemented alongside one another (e.g. in a line, row or column) in the overall circuit. The order might however not follow along such a line, row or column in some embodiments, and may even be changed dynamically.

The control circuitry may be configured, when no said sub-ADC unit of said core sub-ADC units of the set is determined to be a defective sub-ADC unit, to cause the core sub-ADC units of the set to be enabled one after the next following said order. The control circuitry may be configured, when one of the core sub-ADC units of the set is determined to be a defective sub-ADC unit, to cause the spare and core sub-ADC units of the set other than the defective sub-ADC unit to be enabled one after the next following said order. Further, the sub-ADC units of the set may be configured to carry out respective said conversion operations one-by-one following said order in dependence upon whether or not they are enabled.

As above, the sub-ADC units of the set may be connected together in said order. The control circuitry may be configured, when no said sub-ADC unit of said core sub-ADC units of the set is determined to be a defective sub-ADC unit, to cause the core sub-ADC units of the set to each pass on an enable signal one to the next in turn following said order after they have begun their respective conversion operations so as to enable each other in turn. The control circuitry may be configured, when one of said core sub-ADC units of the set is determined to be a defective sub-ADC unit, to cause the spare and core sub-ADC units of the set other than the defective sub-ADC unit to each pass on an enable signal one to the next in turn following said order after they have begun their respective conversion operations so as to enable each other in turn.

The control circuitry may be configured, when no said sub-ADC unit of said core sub-ADC units of the set is determined to be a defective sub-ADC unit and if the spare sub-ADC unit of the set is arranged in said order between two core sub-ADC units of the set, to cause the one of those two core sub-ADC units earlier in the order to pass the enable signal on to the other of those two core sub-ADC units either directly or via the spare sub-ADC unit by configuring the spare-sub-ADC unit to pass on the enable signal immediately upon receiving it. Thus, both direct and indirect transmission of enable signals is envisaged.

The control circuitry may be configured, when one of said core sub-ADC units of the set is determined to be a defective sub-ADC unit and if the defective sub-ADC unit is arranged in said order between two other sub-ADC units of the set, to cause the one of those two sub-ADC units earlier in the order to pass the enable signal on to the other of those two sub-ADC units either directly or via the defective sub-ADC unit by configuring the defective sub-ADC unit to pass on the enable signal immediately upon receiving it. Again, both direct and indirect transmission of enable signals is envisaged.

The order may be circular or repeating such that the first sub-ADC unit of the set in the order follows the last sub-ADC unit of the set in the order to form a new cycle or repetition. Thus, the sub-ADC units of the set may operate in a continuing cycle so as to carry out a continuing supply or flow or sequence of core conversion operations.

The control circuitry may be configured to (actively) select which of the sub-ADC units of the set carry out the core operations. This may involve controlling the sub-ADC units themselves to mark them (e.g. by writing to them as if they were memory cells, or by controlling a switch in each of them) as in use or not. Spare or defective sub-ADC units could be marked as not in use. Core sub-ADC units which are not defective could be marked as in use. Such sub-ADC units may be configured to default to an "in use" setting so that it is only necessary to actively mark the "not in use" sub-ADC units as such. Of course, the reverse situation is also possible. Another option would be to actively enable the individual sub-ADC units when they are intended to carry out a conversion operation.

The analogue-to-digital converter circuitry may have a plurality of said sets of sub-ADC units, for example up to 8 or 16 or even up to 256 or 512, each set for carrying out said given number of core conversion operations. Each such set may comprise for example 16 core sub-ADC units, and optionally one spare sub-ADC unit. The sets of sub-ADC units may be configured to operate synchronously or asynchronously. The sets of sub-ADC units may be configured to carry out their core conversion operations in parallel, or partially in parallel such as in a staggered or interleaved or partially overlapped manner.

The sub-ADC units may be arranged in an array having rows and columns, with each set of sub-ADC units being arranged in its own column of the array. All of the (or any) spare sub-ADC units may be arranged in the same row of the array, or different columns (sets) may have their spare sub-ADC units in different rows.

The analogue-to-digital converter circuitry may be configured to carry out said given number of core conversion operations within a given time period. This may be the case both for synchronous and asynchronous operation. Where multiple sets are provided, the given time period may be common to the sets, in the sense of each set having a time period of the same length (with those time periods staggered) and even in the sense of the same time period being applied to all of the sets.

The analogue-to-digital converter circuitry may be configured to carry out the given number of core conversion operations in synchronization with a clock signal.

The analogue-to-digital converter circuitry may comprise determination circuitry configured to determine whether any of said sub-ADC units is defective. Such determination circuitry may be configured to make the determination based upon one or more conversion results output by the sub-ADC units. For example, such determination circuitry may be configured to analyse the conversion results output by individual sub-ADC units, one-by-one or in groups in parallel or all together in parallel. The determination circuitry may be configured to identify signatures in the conversion results which correspond to gain, offset and/or linearity errors.

According to an embodiment of a second aspect of the present invention there is provided an IC chip, such as a flip chip, comprising the analogue-to-digital converter circuitry of the aforementioned first aspect of the present invention.

The present invention extends to method aspects corresponding to the apparatus aspects.

Figure 10:
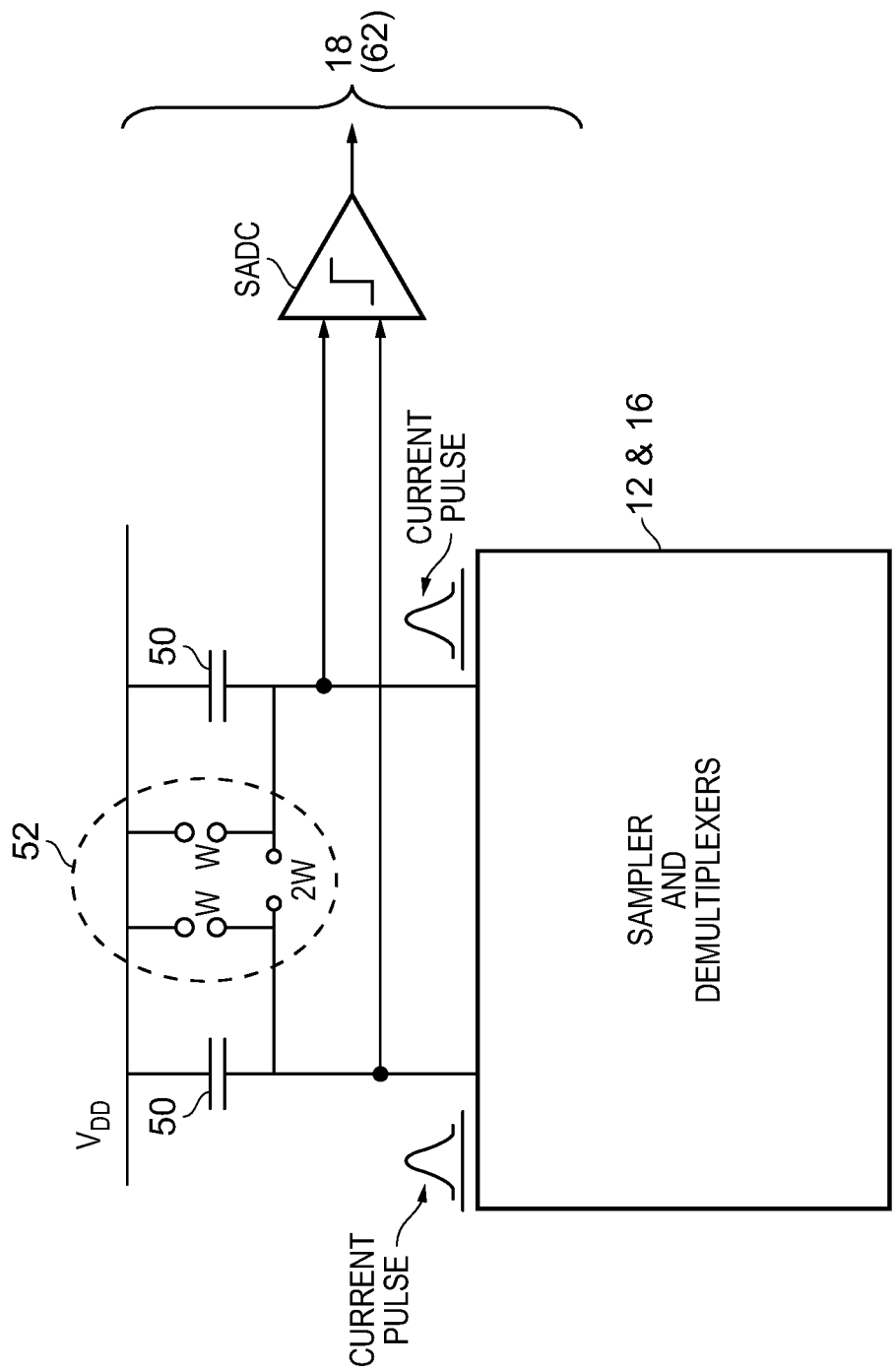
Figure 11:
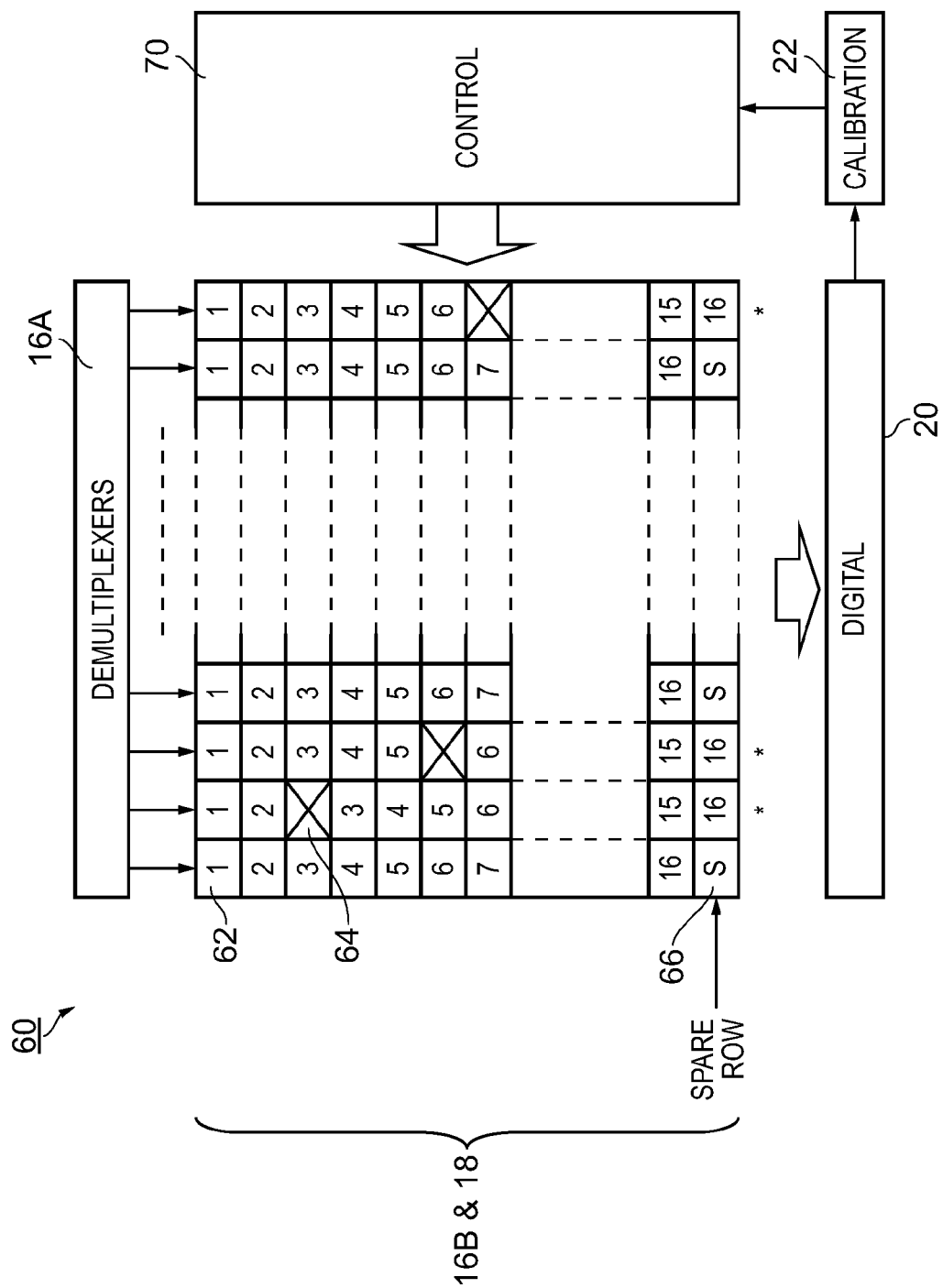

Reference will now be made, by way of example only, to the accompanying drawings, of which:

FIG. 1, discussed above, is a schematic diagram of analogue-to-digital converter circuitry to which the present invention may be applied;

FIG. 2, discussed above, is a schematic diagram of a four-phase current-mode sampler corresponding to the sampler of FIG. 1;

FIG. 3, discussed above, shows schematic wave forms of clock signals $\Theta_0$ to $\Theta_3$ and output currents $IOUT_A$ to $IOUT_D$;

FIG. 4, discussed above, is a schematic diagram of parts of the FIG. 1 circuitry;

FIG. 5, discussed above, is a schematic diagram useful for understanding operation of the demultiplexers in FIG. 4;

FIG. 6, discussed above, is a schematic diagram useful for understanding the principal of operation of the FIG. 1 ADC banks;

FIG. 7, discussed above, is a schematic diagram useful for understanding a possible application of SAR circuitry in the FIG. 1 circuitry;

FIG. 8, discussed above, is a schematic diagram useful for understanding a possible layout of the FIG. 1 ADC circuitry;

FIG. 9, discussed above, is a schematic diagram useful for understanding the concept of calibration techniques employed in the FIG. 1 circuitry;

FIG. 10 is a schematic diagram useful for further understanding the general layout of the sub-ADC units used per path in the FIG. 1 circuitry; and FIG. 11 is a schematic diagram of circuitry embodying the present invention.

The present inventors have investigated noise and distortion performance issues with the circuitry 10 of FIG. 1. This has included an investigation into the calibration techniques mentioned above, and the operation of the different units in that circuitry.

Detailed investigations have identified a problem that appears to relate to the sub-ADC units themselves, and does not appear in all instances of the same circuit even when those circuits are implemented in the same way (e.g. using the same process, same die, same conditions, etc.). That is, whether and how the performance issues may manifest themselves differs from chip to chip. The identified problems also appear to be attributable to different sub-ADC units in different instances of the same circuit.

Based on such detailed investigations, the inventors have deduced that a possible source of the performance problem is one or more switches in the sub-ADC units being "leaky". Simulations carried out by the inventors support this theory.

FIG. 10 is a schematic diagram useful for further understanding the general layout of the sub-ADC units used per path in the circuitry 10. For ease of comparison, the sub-ADC units in FIG. 8 have been denoted with the reference numeral 62, and will be commented on in more detail.

Also for ease of understanding, where possible the same reference numerals as in FIGS. 1 and 6 have been employed in FIG. 10. Complementary paths are shown, with the current pulses for those paths producing a voltage over the terminating capacitors 50, those voltages being compared and then the result of the comparison being converted into a digital output value representative of the difference between the two compared voltages. The sub-ADC unit (SADC) may for example operate as a SAR (Successive Approximation Register) ADC as already explained in connection with FIG. 7.

Possible switches that may be leaky (e.g. with relatively small leakage, e.g. 200 nA) are indicated in FIG. 10 as corresponding to reset switch 52 of FIG. 6. Such switches may be used for resetting the voltages over the capacitors between current pulses.

The issue with such leaky switches is that the leakiness is suspected to be process-related and occurs effectively at random, with a very low proportion of such switches having the defect. For example, it may be that 1 in 1,000 or 1 in 10,000 such switches are defective, at random. However, as will be appreciated from the description above, the circuitry 10 uses many sub-ADC units. Considering that an analogue-to-digital converter (ADC) channel corresponding to circuitry 10 of FIG. 1 may have e.g. 256 sub-ADC units, this equates to 1024 sub-ADC units for 4 channels, 2048 sub-ADC units for 8 channels and 4096 sub-ADC units for 16 channels and 8192 sub-ADC units for 32 channels. Thus, the proportion of chips with a defective sub-ADC may be high (e.g. even up to every chip) so that it is not feasible to simply discard defective chips.

Recall from FIG. 8 that the sub-ADC unit 62 may be arranged in an array of rows and columns, with the final stage of demultiplexing 16B being carried out in the array.

Such an array is shown in FIG. 11, which is a schematic diagram of circuitry 60 embodying the present invention.

Circuitry 60 corresponds to circuitry 10 of FIG. 1 with like reference numerals being used for comparison purposes, and with some elements omitted simply for ease of understanding. Circuitry 60 comprises the first demultiplexer stage 16A, the second demultiplexer stage 16B in combination with the ADC banks 18, the digital section 20, the calibration section 22, and a control section (control circuitry) 70. It will become apparent that the structure and operation of the second demultiplexer stage 16B and the addition of the control section 70 differentiates the circuitry 60 from circuitry 10.

The array of sub-ADC units (or circuits) 62 of FIG. 8 is shown in FIG. 11, but with the columns in FIG. 11 corresponding to the rows in FIG. 8. The example here considers there being 256 sub-ADC units (16 rows, 16 columns), with each sub-ADC unit 62 being represented by a box in the array for simplicity.

Each column of sub-ADC units is connected to the same output from the preceding demultiplexer stage 16A of the circuitry 60 (see FIG. 8), with the sub-ADC units 62 in each column being selected one-by-one in order (e.g. down the column)—for example using switches such as those shown for each sub-ADC unit 62 in FIG. 8—thus implementing the final stage of demultiplexing 16B as well as the basic sub-ADC function 18.

In one embodiment of the present invention, an additional "spare" or redundant row of sub-ADC units 66 is provided in addition to the existing sub-ADC units (which will be referred to here as "core" sub-ADC units), with the spare sub-ADC units 66 being generally the same as the sub-ADC units 62. The spare sub-ADC unit in a column is then used in the present embodiment in place of a sub-ADC unit 62 found to be defective. A defective sub-ADC unit may be one which is fully non-operational, i.e. broken to the extent that it cannot perform an analogue-to-digital conversion, or one whose operation is simply unsatisfactory to the extent that it would be better to use a spare sub-ADC unit. Such an unsatisfactory sub-ADC unit may for example generate offset, gain and/or linearity errors. In the "leaky switch" case described earlier, this may appear as a linearity error of tens of LSBs which far exceeds a level of error which may be considered acceptable.

It will be appreciated that the sub-ADC units 62 may be identified as being defective by the calibration unit 22 using the general calibration principles explained above in connection with FIG. 9. However, unlike the situation explained above where errors are detectable because current pulse sizes are varied from what is expected in an error-free case, in the present situation concerning defective sub-ADC units there is not the situation where an increase in the size of one pulse leads to the decrease in the size of another. That is, defective sub-ADC units take their effect downstream of any errors in the pulse sizes themselves. However, offset, gain and/or linearity errors attributable to the sub-ADC units leave "signatures" in the digital output data which can be readily or easily detected by the calibration unit because they comprise much worse values (in the sense of representing errors) than typical values, for example taking account of "typical" values expected due to variations in current pulse sizes as discussed earlier.

Thus, the calibration unit 22 operates based on the digital values output from the sub-ADC units to the digital section 20, and identifies any defective sub-ADC units. The control unit 70 is then operable to select or control which of the sub-ADC units in the array carries out the necessary, i.e. core, conversion operations. This involves controlling or selecting a spare sub-ADC unit 66, in a column in which a defective sub-ADC unit has been identified by the calibration unit 22, such that the spare sub-ADC unit 66 carries out one of the core conversion operations and such that the defective sub-ADC unit does not.

In FIG. 11, the spare row is shown as the lower-most row, but this is of course not essential and neither do all of these spare sub-ADC units 66 need to be in the same row. Preferably, at least one spare sub-ADC unit 66 is provided per column. In some embodiments, two or more spare sub-ADC units 66 are provided per column.

In column 1 (the left-most column), for example, it is indicated that none of the core sub-ADC units 1 to 16 is defective, and hence the sub-ADC unit in the spare row is marked with an "S" indicating that it is spare and not used. The core sub-ADC units may thus carry out the 16 core conversion operations for that column in the order identified (although of course any other order could be adopted).

In column 2, the third core sub-ADC unit 64 is marked with an "X" as having been identified by the calibration unit 22 as being defective and controlled by the control unit 70 such that it is not used for core conversion operations. The sub-ADC unit in the spare row has therefore been selected or controlled by the control unit 70 such that it is the 16th sub-ADC unit used in that column for core conversion operations. The core sub-ADC units (except the defective one) and the spare sub-ADC unit may thus carry out the 16 core conversion operations for that column in the order identified (although of course any other order could be adopted, such as the spare sub-ADC unit taking over core conversion operation 3 instead of 16).

Thus, the numbering from 1 to 16 in each column refers to the sub-ADC units which are actually used, and the core conversion operations which they perform suggesting an example order. Columns 3 and 16 (along with column 2) are also shown as having defective sub-ADC units and therefore as using the sub-ADC unit in the spare row. These columns (2, 3 and 16) are marked in FIG. 11 with an asterisk for ease of identification.

As above, the presence of a defective sub-ADC unit in any one column may be identified by examining the output data digitally. The "signatures" of the three switches shown in FIG. 10 (the reset switches and the bridging switch) when leaky are different from one another, so that it is possible for the calibration unit 22 actually to identify exactly which switch is leaky. By examining the output data, it will be appreciated that the calibration unit 22 can identify offset, gain and linearity errors. Since a leaky switch once fabricated cannot practically be repaired or "fixed", the control unit 70 is employed to mark the entire sub-ADC circuit concerned as defective.

The process of identifying any defective sub-ADC units could be carried out at startup (e.g. using test signals to create test output data), given that the defect would have occurred in manufacture of the chip concerned, but the process could also be carried out during runtime (i.e. using "live" data, given that the signatures are detectable even in such live data). It will be appreciated that any other sub-ADC defect or failure (i.e. other than such leaky switches as mentioned above) having such signatures could also be compensated for using the same mechanism of marking the sub-ADC unit as defective and using a spare sub-ADC unit.

There are advantages in the "array with a spare row" arrangement of FIG. 11. For example, the sub-ADC units in each column may be linked together so that one passes a SYNC (or enable) pulse on to the next down the column after its turn to perform a core conversion operation, so that the array effectively controls itself. In this case, there may only be the requirement to input SYNC pulses periodically per column, or the SYNC pulse system may wrap around for each column so that the core conversion operations continue in a cycle.

Any spare (if not used) or defective sub-ADC unit could then be simply set by the control unit 70 to pass on a SYNC pulse without delay (i.e. such that it does not perform a core conversion operation before passing it on). That is, sub-ADC units may then be marked as "defective" (i.e. disabled) or "spare" (also effectively disabled) when appropriate by configuring them with the control unit 70 such that they pass on the SYNC pulses without delay. Similarly, a spare sub-ADC unit may then being marked as "in use" or enabled by configuring it with the control unit 70 such that it does not pass on a SYNC pulse without delay, but instead performs or initiates a core conversion operation and then passes on the SYNC pulse (as for a normal operational core sub-ADC unit). It may be considered that, although the added spare row of sub-ADC units comes with an area penalty, there is no power or complexity penalty.

As another option, rather than configuring the sub-ADC units themselves to pass on such SYNC pulses as above, the control unit 70 could be configured to individually provide SYNC pulses to the sub-ADC units when they are intended to carry out their core conversion operations. For example, the control unit 70 could control a switch per sub-ADC unit such as those shown in FIG. 8 alongside each sub-ADC unit.

Other possibilities for dealing with defective sub-ADC units have also been envisaged, for example without needing to provide such spare sub-ADC units and thus avoiding the area penalty mentioned above.

For example, defective sub-ADC units could be disabled as in column 2 of FIG. 11, but instead of using (or even having) the spare sub-ADC unit 64 the remaining 15 core sub-ADC units could be configured to carry out core conversion operations faster. That is, the remaining 15 core sub-ADC units could be configured to carry out the 16 core conversion operations in the same time window as would have the existing 16 core sub-ADC units if one had not been found defective.

That is, assuming that the core conversion operations need to be carried out one after the other in a sequence, in line with the operation of the circuitry 10 of FIG. 1 as explained above, the remaining 15 core sub-ADC units could be configured to carry out the 16 core conversion operations quicker so that effectively one of them manages to carry out two conversion operations in the time window.

One possible way to achieve this would be, assuming that the sub-ADC units operate synchronously based on a clock signal, to increase the clock frequency. However, to do this for a single column may create complex timing and synchronisation issues, and risk inaccurate conversions. Thus, this option may incur a noise and/or complexity penalty.

Another option would be to configure the sub-ADC circuits to operate asynchronously (either always, or only when a defective sub-ADC unit has been detected), and increase VDD to increase their speed of operation. However, increasing VDD incurs a power penalty.

A further option, again using asynchronous operation, would be to configure the sub-ADC units to do a 7b conversion rather than an 8b conversion (which they might carry out in the absence of a defective sub-ADC unit). However, decreasing the resolution incurs a higher noise/lower resolution penalty.

These options avoid the area penalty associated with the spare sub-ADC units of FIG. 11, but suffer the other mentioned penalties instead, which may include more complex requirements for logic, clocking, synchronisation and/or calibration (i.e. costing some power and area in logic). Nevertheless, in some applications one of these options may be preferred over the others.

It will be appreciated that the circuitry disclosed herein could be described as an ADC. Circuitry of the present invention may be implemented as integrated circuitry, for example on an IC chip such as flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards.

The present invention may be embodied in many different ways in the light of the above disclosure, within the spirit and scope of the appended claims.

The invention claimed is:

1. Analogue-to-digital converter circuitry, comprising:
a set of sub-ADC units each for carrying out analogue-to-digital conversion operations, the set comprising a given number of core sub-ADC units for carrying out said given number of core conversion operations; and
control circuitry operable, when a said sub-ADC unit is determined to be a defective sub-ADC unit, to cause the core conversion operations to be carried out by the sub-ADC units of the set of sub-ADC units other than the defective sub-ADC unit,
wherein:
the set of sub-ADC units comprises at least one spare sub-ADC unit in addition to said core sub-ADC units;
the control circuitry is operable, when one of said core sub-ADC units of the set is determined to be a defective sub-ADC unit, to cause the core conversion operations to be carried out by the spare and core sub-ADC units of the set of sub-ADC units other than the defective sub-ADC unit;
the sub-ADC units of the set are organised into an order;
the control circuitry is configured, when no said sub-ADC unit of said core sub-ADC units of the set is determined to be a defective sub-ADC unit, to cause the core sub-ADC units of the set to be enabled one after the next following said order, and, when one of the core sub-ADC units of the set is determined to be a defective sub-ADC unit, to cause the spare and core sub-ADC units of the set other than the defective sub-ADC unit to be enabled one after the next following said order;
the sub-ADC units of the set are configured to carry out respective said conversion operations one-by-one following said order in dependence upon whether or not they are enabled;
the analogue-to-digital converter circuitry has a plurality of said sets of sub-ADC units, each set for carrying out said given number of core conversion operations; and
said sub-ADC units are arranged in an array having rows and columns, with each set of sub-ADC units being arranged in its own column of the array, with the order of the sub-ADC units of each set of sub-ADC units corresponding to a row-by-row progression along the column concerned, and with the spare sub-ADC units being arranged in the same row of the array.

2. The analogue-to-digital converter circuitry according to claim 1, wherein:
the control circuitry is operable, when no said sub-ADC unit of said core sub-ADC units of the set is deteimined to be a defective sub-ADC unit, to cause the core conversion operations to be carried out by the core sub-ADC units of the set.

3. The analogue-to-digital converter circuitry according to claim 1, wherein:
the sub-ADC units of the set are connected together in said order; and
the control circuitry is configured, when no said sub-ADC unit of said core sub-ADC units of the set is determined to be a defective sub-ADC unit, to cause the core sub-ADC units of the set to each pass on an enable signal one to the next in turn following said order after they have begun their respective conversion operations so as to enable each other in turn, and, when one of said core sub-ADC units of the set is determined to be a defective sub-ADC unit, to cause the spare and core sub-ADC units of the set other than the defective sub-ADC unit to each pass on an enable signal one to the next in turn following said order after they have begun their respective conversion operations so as to enable each other in turn.

4. The analogue-to-digital converter circuitry according to claim 3, wherein:
the control circuitry is configured, when no said sub-ADC unit of said core sub-ADC units of the set is determined to be a defective sub-ADC unit and if the spare sub-ADC unit of the set is arranged in said order between two core sub-ADC units of the set, to cause the one of those two core sub-ADC units earlier in the order to pass the enable signal on to the other of those two core sub-ADC units either directly or via the spare sub-ADC unit by configuring the spare-sub-ADC unit to pass on the enable signal immediately upon receiving it.

5. The analogue-to-digital converter circuitry according to claim 3, wherein:
the control circuitry is configured, when one of said core sub-ADC units of the set is determined to be a defective sub-ADC unit and if the defective sub-ADC unit is arranged in said order between two other sub-ADC units of the set, to cause the one of those two sub-ADC units earlier in the order to pass the enable signal on to the other of those two sub-ADC units either directly or via the defective sub-ADC unit by configuring the defective sub-ADC unit to pass on the enable signal immediately upon receiving it.

6. The analogue-to-digital converter circuitry according to claim 1, wherein said order is circular such that the first sub-ADC unit of the set in the order follows the last sub-ADC unit of the set in the order.

7. The analogue-to-digital converter circuitry according to claim 1, wherein:
the control circuitry is configured to select which of the sub-ADC units of the set carry out the core operations.

8. The analogue-to-digital converter circuitry according to claim 1, configured to carry out said given number of core conversion operations:
within a given time period; or
in synchronization with a clock signal.

9. The analogue-to-digital converter circuitry according to claim 1, comprising determination circuitry configured to determine whether any of said sub-ADC units is defective, optionally based upon one or more conversion results output by the sub-ADC units.

10. An IC chip, comprising the analogue-to-digital converter circuitry according to claim 1.

* * * * *